United States Patent [19]

Curran et al.

[11] Patent Number: 5,554,946
[45] Date of Patent: Sep. 10, 1996

[54] TIMING SIGNAL GENERATOR

[75] Inventors: Brian W. Curran, Saugerties, N.Y.; Rafael Blanco, Burlington, Vt.

[73] Assignee: International Business Machines Corporation, Armonk, N.Y.

[21] Appl. No.: 224,927

[22] Filed: Apr. 8, 1994

[51] Int. Cl.[6] .................................................. H03K 5/13
[52] U.S. Cl. ........................ 327/172; 327/152; 327/153; 327/175; 327/291; 327/299; 327/269
[58] Field of Search ..................................... 327/164, 166, 327/172, 174–176, 152, 153, 161, 276, 299, 231, 233, 234, 235, 242, 248, 249, 250, 251, 141, 291, 261, 262, 269, 263

[56] References Cited

U.S. PATENT DOCUMENTS

| | | | |
|---|---|---|---|
| 4,063,308 | 12/1977 | Collins et al. | 364/200 |
| 4,468,624 | 8/1984 | Rehbein et al. | 328/55 |
| 4,494,021 | 1/1985 | Bell et al. | 307/591 |
| 4,496,861 | 1/1985 | Bazes | 307/602 |
| 4,516,861 | 5/1985 | Frew et al. | 328/55 |
| 4,568,841 | 2/1986 | Mayhew | 307/265 |
| 4,626,716 | 12/1986 | Miki | 327/270 |
| 4,675,546 | 6/1987 | Shaw | 307/265 |
| 4,677,499 | 6/1987 | Shirota et al. | 327/152 |
| 4,785,428 | 11/1988 | Bajwa et al. | 365/233 |
| 4,809,221 | 2/1989 | Magliocco et al. | 364/900 |
| 4,864,160 | 9/1989 | Abdoo | 307/259 |
| 4,908,842 | 3/1990 | Collins | 327/161 |
| 5,049,766 | 9/1991 | van Driest et al. | 307/603 |
| 5,237,224 | 8/1993 | DeLisle et al. | 307/602 |
| 5,246,636 | 9/1993 | Minnick et al. | 395/425 |
| 5,252,977 | 10/1993 | Lueker et al. | 341/182 |
| 5,313,501 | 5/1994 | Thacker | 327/161 |

FOREIGN PATENT DOCUMENTS

| | | |
|---|---|---|
| 63-137339 | 6/1988 | Japan . |
| 2241220 | 9/1990 | Japan . |
| 3099354 | 4/1991 | Japan . |

OTHER PUBLICATIONS

IBM Technical Disclosure Bulletin, "Digital Timing Generator," vol. 32, No. 4A, Sep. 1989, pp. 437–438.

*Primary Examiner*—Timothy P. Callahan
*Assistant Examiner*—T. Lam
*Attorney, Agent, or Firm*—Lynn L. Augspurger; Laurence J. Marhoefer

[57] ABSTRACT

A programmable, timing signal generator propagates a digital wave along a delay chain comprised of series connected inverters that has sufficient stages that the edge of the wave will not propagate to the end during one system clock cycle time. The delay chain is sampled once each clock cycle, and the point to which the wave has progressed is encoded. Programmable, fine leading and fine trailing edge registers store, as a fraction of the clock cycle time, the desired locations of the timing signal leading and trailing edge relative to the clock edges.

2 Claims, 4 Drawing Sheets

TIMING SIGNAL GENERATOR

BACKGROUND OF THE INVENTION

1. Field of the Invention

This invention relates to an improved method and apparatus for generating critical timing signals. For example, timing signals required in the operation of dynamic random access memories (DRAMs). More particularly it relates to a digital system and method to generate precisely positioned timing signals, independently of system component variations due to manufacturing process variations, or temperature variations, or both, and independently of clock edge location.

2. Description of the Prior Art

There have been a number of systems used in the prior art to generate critical timing signals. For DRAMs, such signals include the leading and trailing edges of a row address strobe, a column address strobe, and a signal to transition from row address to column address. Analogue delay lines, digital delay lines, and programmable cycle delays have been used in the prior art to generate these critical timing edges. While generally satisfactory, each of these prior art approaches has certain limitations and disadvantages. Significantly, previous programmable cycle delays have restricted critical signal edges to clock boundaries or delayed them sufficiently to guarantee they do not arrive too early under best case tolerance and operating conditions, and thus in either case have compromised performance. For example, if the system operation calls for a timing edge only a short interval after the clock edge, with the prior art system the timing signal would be generated at the next clock edge, resulting in the loss of time on the order of a whole clock cycle.

SUMMARY OF THE INVENTION

One object of this invention is the provision of a programmable timing signal generator that permits the leading and trailing edges of the timing signal to be programmably specified, to be specified independently of one another, and to be specified independently of the clock cycle boundaries.

Another object of the invention is the provision of a programmable timing signal generator that dynamically corrects for process tolerance build-up in the manufacture of the system and also dynamically corrects for the effects of temperature changes on the operation of the system.

A further object of the invention is the provision of a programmable timing signal generator that allows a single timing signal generator design to operate optimally in different systems with different system timing cycles.

Briefly, this invention contemplates the provision of a programmable, timing signal generator in which a digital wave propagates along a delay chain comprised of series connected, inverters that has sufficient stages that the edge of the wave will not propagate to the end during one system clock cycle time. The distance the wave propagates along the delay chain varies with variations in manufacturing tolerance build-up and with variations in temperature and can thus compensate for these variations. The delay chain is sampled once each clock cycle, and the point to which the wave has progressed is encoded. Programmable, fine leading and fine trailing edge registers store, as a fraction of the clock cycle time, the desired locations of the timing signal leading and trailing edge relative to the clock edges. The fractional values and the encoded position to which the wave edge has propagated are multiplied together and rounded to a whole number in order to select phases of the delayed wave edge corresponding to the desired leading edge and trailing edge position of the timing signal relative to the clock edge. Pulse construction logic combines start and stop pulses, the system clock, and the selected phases of the wave train to operate a timing pulse. The selected phases of the wave train are combined with leading and trailing edges located relative to the clock edges as specified by the fractional values stored in the lead and lag registers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
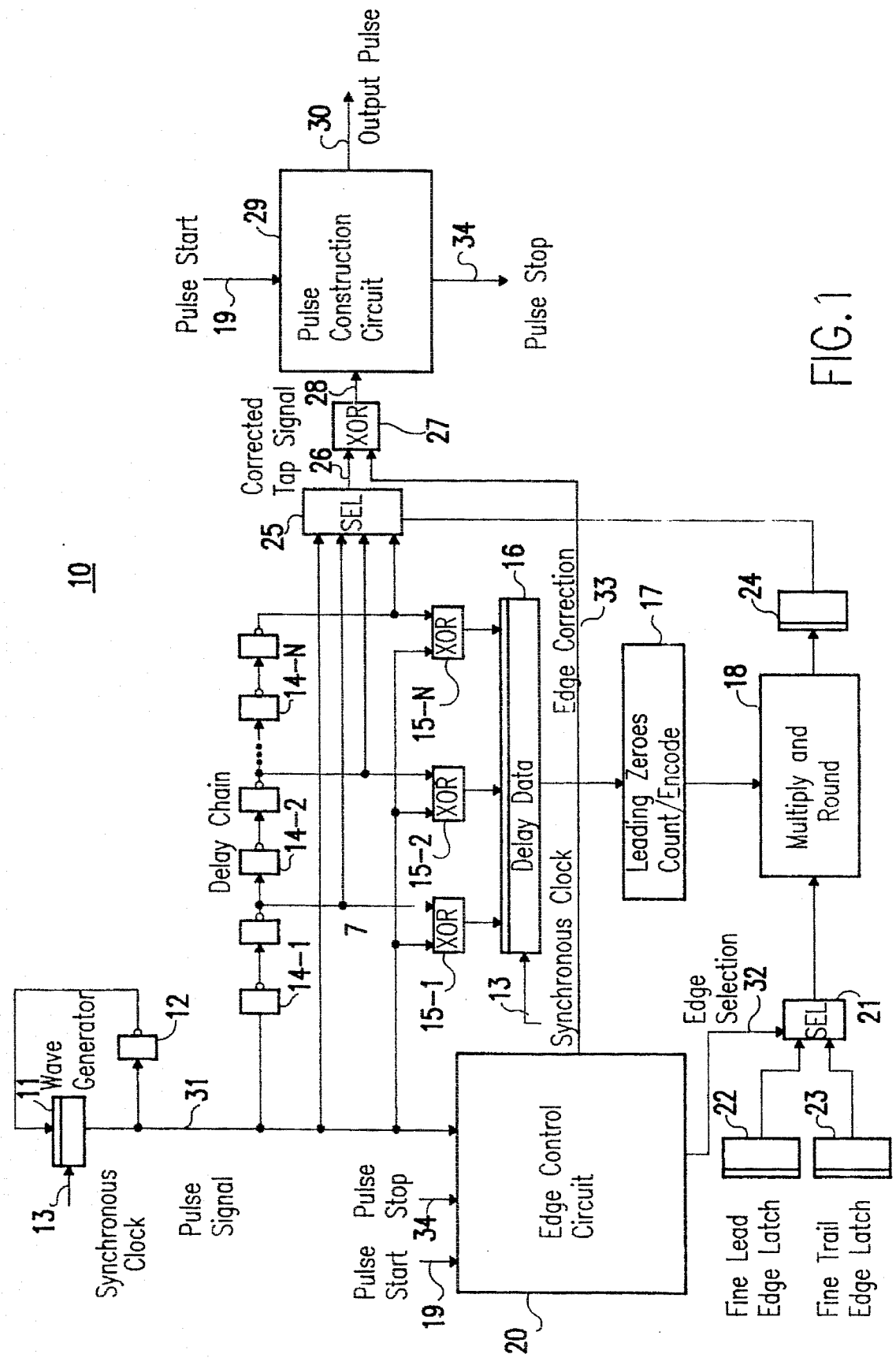
FIG. 1 is a schematic diagram of one embodiment of a timing signal generator in accordance with the teachings of this invention.

Referring now to FIG. 1 of the drawings, a wave generator indicated by the general reference number 10 generates a continuous wave train of alternating logic level zeros and logic level ones in response to a synchronous clock signal input 13. The wave generator in this embodiment comprises a single bit wave generator latch 11 and an inverter 12 that generates an output pulse train on line 31 synchronized with the clock signal 13, but with a cycle time equal to twice the clock cycle time.

Lead 31 couples the wave generator output train to an input of a delay chain comprised of series connected inverter pairs 14-1 through 14-N. As will be appreciated by those skilled in the art, an edge of the wave train will propagate along the delay chain at a rate determined by the switching time of each inverter gate, which in turn is a function of temperature and variations in gate switching time that are within specified device tolerances. The delay chain is made sufficiently long relative to the clock cycle that the delayed edge of the wave train will not reach the end of the chain within one clock cycle. A tap 7 is connected from each delay chain pair as one input to an exclusive OR gate 15-1 through 15-N. Each tap 7 is also connected to a selector switch 25. Lead 31 couples the wave train as the other input to each of the exclusive OR gates 15-1 through 15-N. The clock signal 13 reads the outputs of the gates 15-1 through 15-N into a data latch 16 at the end of every clock cycle so that the data latch 16 contains leading zeros and trailing ones as an indication of distance the wave train has propagated along the delay chain in one full clock period. An encoder 17 encodes the data in data latch 16 (in this embodiment of the invention the number of leading zeroes) in order to provide a binary encoded value of the gate pair to which the wave train propagated during the clock cycle. The following truth table illustrates this encoding procedure.

| input | output |
| --- | --- |
| 1xxxx..xx | 00.000 |
| 01xxx..xx | 00.001 |
| 001xx..xx | 00.010 |
| 0001x..xx | 00.011 |
| ⋮ | |
| 00000..01 | 01.111 |
| 00000..00 | 10.000 |

The output of the encoder 17 is coupled to a multiplying and rounding circuit 18. A selector 21 couples fractional lead values stored in a programmable fine lead register 22 and fractional log values stored in a fine lag register 23 as other inputs to multiplier 18. These fractional values designate, in terms of a fraction of the clock cycle, the desired position of the critical leading and laging timing edges relative to the clock edges. A lead 32 connects the selector to an edge control logic circuit 20. The selector 21 selectively couples the lead and lag registers to the multiplier 18, effectively multiplexing these inputs so that only one multiplier circuit is required.

A pulse start signal 19, pulse stop signal 34 and the wave train signal on lead 31 are connected to the edge control circuit 20. The edge control circuit 20 provides two functions. First, the selection of the fine lead edge latch 22 or fine trail edge latch 23 and, second, the capability to convert rising edges to falling edges and vice versa. The fine lead edge latch 22 and fine trail edge latch 23 each contain a fractional value which specifies the location of the leading and trailing edges of pulse within a clock period. For example if a pulse with a leading edge at 5 ns into a clock cycle is desired and the clock period is 20 ns then the fine lead edge latch 22 would be initialized with the value 0.25. Upon activation of the pulse start signal 19 the edge control logic 20 activates the edge selection signal on lead 32. The edge selection signal controls the selector 21 which selects the fine lead edge latch 22. In the subsequent clock cycle the edge control logic 20 deactivates the edge selection signal on 32. The selector 21 subsequently selects the fine trail edge latch 23. The edge control logic 20 continues to select this latch until the next activation of the pulse start signal 19.

A staging latch 24 couples the output of the multiplier 18 to the selector 24, which selects a tap on the delay chain in accordance with the desired values specified by the lead and lag registers 32 and 34.

Adjacent inverter pairs 14 are separated in time by equal incremental amounts. The function of multiplier and round circuit 18 is given by the following equation:

$$F(\text{multiply and round}) = INT\ [A(0{:}M{-}1) * B(0{:}N{-}1) + 0.5]$$

where A is the M bit fractional fine lead (or trail) edge latch value and B is the N bit output of the leading zeroes count and encode circuit. For example if A=0.1011 and B=11010 then the multiply and round output is INT [0.1011 * 11010+ 0.1]=INT [10001.111+0.1]=INT [10010.011]=10010.

The multiply and round circuit 18 multiplies the selector 21 output with the output of the leading zeroes count and encode circuit 17. The multiply and round circuit 18 thus calculates the number of inverter stages in the specified fraction of a clock cycle. The multiply and round circuit 18 output is stored in the staging latch 24. The staging latch 24 output controls the selector 25. The delay chain taps, i.e., the outputs of the inverter pairs 14-1, 14-2, . . . 14-N are connected to the inputs of the selector 25. The selector 25 output is referred to herein as tap signal 26. The tap signal 26 switches at a specified fraction into the clock period. The tap signal 26 is connected to an input of an exclusive-OR circuit 27. The edge control circuit 20 outputs an edge correction signal on line 33, which is connected to the other input of the exclusive-OR circuit 27. In response to the signal on line 33, the exclusive-OR circuit 27 can invert the tap signal 26 when a rising edge must be converted to a falling edge and when a falling edge must be converted to a rising edge. The exclusive-OR circuit 27 output is referred to herein as a corrected tap signal 28. The corrected tap signal 28 and the pulse start signal 19 are input to a pulse construction circuit 29. The pulse construction circuit 29 is activated with the pulse start signal 19. Once activated the pulse construction circuit 29 transmits the (lead) corrected tap signal 28 to the output pulse 30 line. In subsequent intermediate clock cycles, the pulse construction circuit 29 itself activates the output pulse 30. On the trailing edge cycle, the pulse construction circuit transmits the (trailing) edge signal 28 to the pulse signal 30 line. In subsequent clock cycles the pulse construction circuit 29 deactivates the output pulse 30 line by blocking the transmission of the corrected tap signal 28 to the output pulse 30 line.

Figure 2:
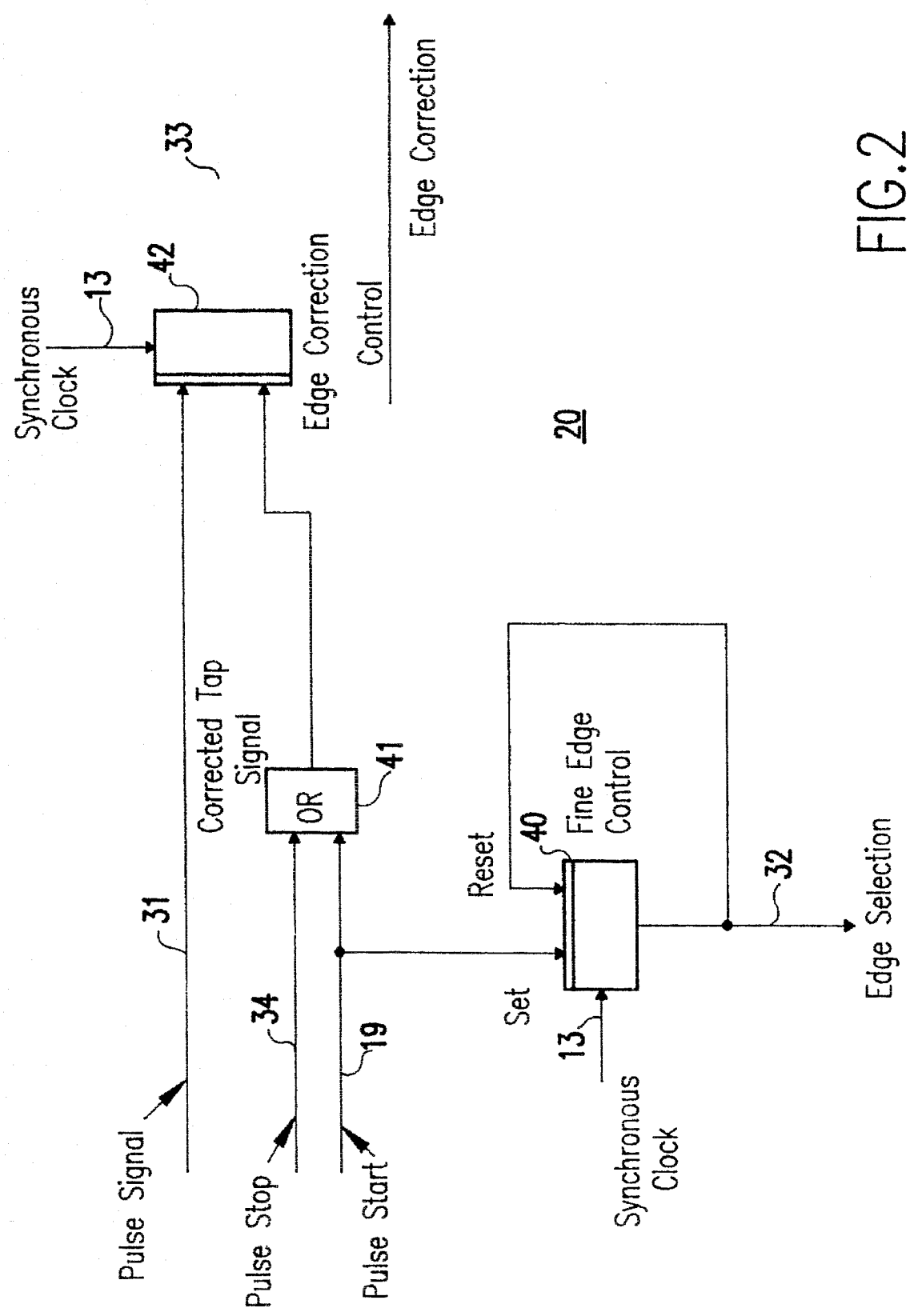
FIG. 2 is a block diagram of the edge control circuit shown in FIG. 1.

The edge control circuit 20 is shown in FIG. 2. The pulse start signal 19 is latched into a fine edge control latch 40 with the synchronous clock 13. The fine edge control latch 40 outputs the edge selection signal on line 32. A logical high level on the fine edge control latch 40 output resets the fine edge control latch 40 on the subsequent synchronous clock signal input 13. Thus the fine edge control latch 40 and edge selection signal on line 32 are activated for only one clock cycle. This results in the selection of the fine lead edge latch 22 for one cycle. The pulse stop 34 and pulse start 19 signals are connected to the inputs of OR circuit 41. The output of OR circuit 41 gates the wave signal on lead 31 into an edge correction control latch 42. The OR circuit 41 output is latched with the synchronous clock 13. The output of the edge correction control latch 42 drives the edge correction signal on lead 33.

Figure 3:
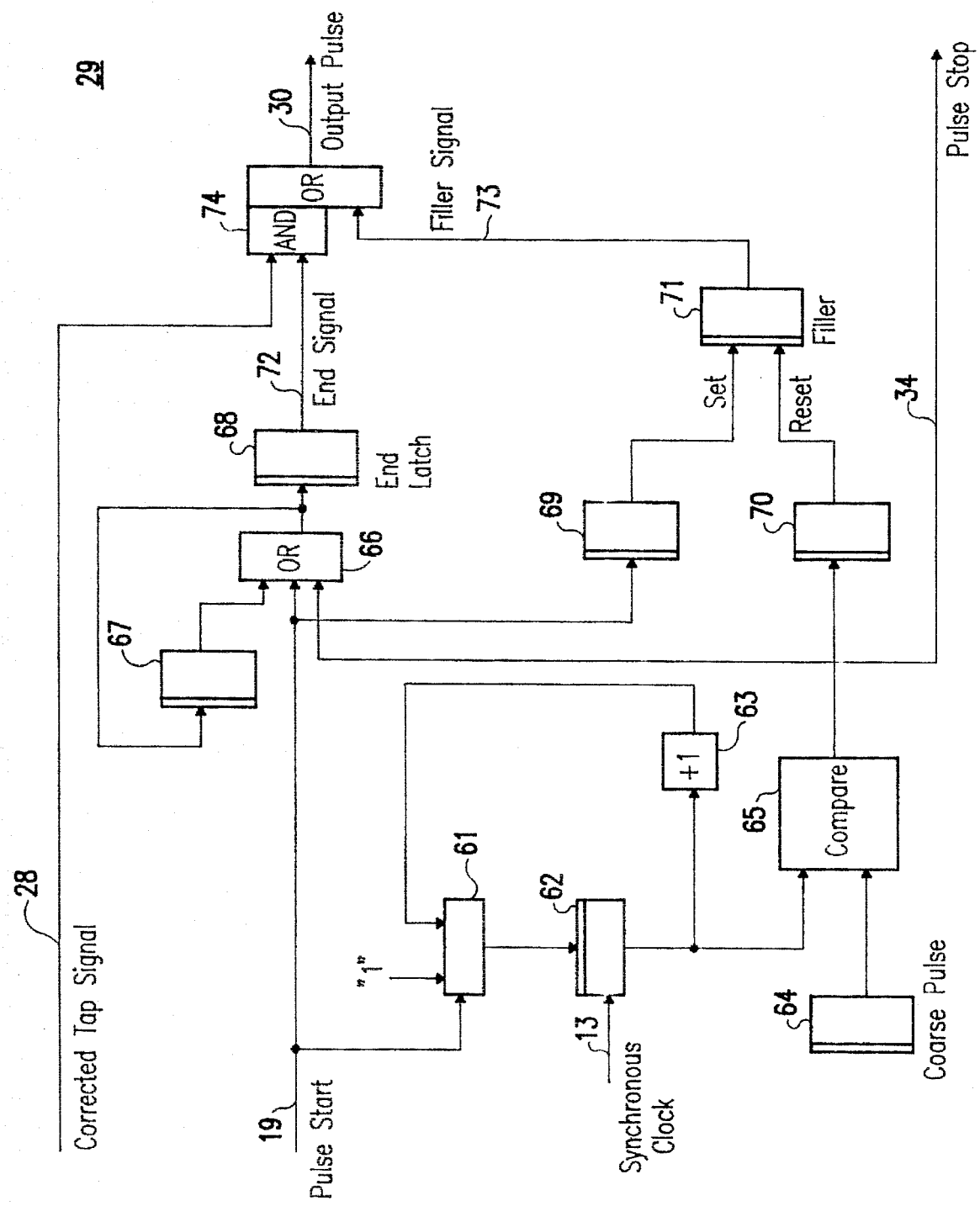
FIG. 3 is a block diagram of the pulse construction circuit shown in FIG. 1.

The pulse construction circuit 29 is shown in FIG. 3. The (one cycle) activation of a pulse start signal on line 19 causes a initialization value '1' to be selected by a selector 61. The output of selector 61 is latched into a (multiple bit) cycle counter latch 62 with the synchronous clock 13. The output of the cycle counter 62 is connected to the input of an incrementer 63 and the incrementer 63 output is connected to the other input of the selector 61. In clock cycles subsequent to the initial cycle, the pulse start signal 19 is deactivated and thus the selector 61 selects the incrementer 63 output. This output of selector 61 is also latched into the cycle counter 62 with the synchronous clock 13. In this manner the cycle counter 62 is initialized to 1 and counts upward. The value stored in a coarse pulse width latch 64 is compared with the value of the cycle counter latch 62 in a compare circuit 65. When these values are equal, the compare circuit 65 output is activated. A pulse stop signal on line 34 also is activated, as it is connected to the compare circuit 65 output. The pulse stop signal 34, and pulse start signal 19 and a staging latch 67 output are connected to the inputs of an OR circuit 66. The OR circuit 66 output is latched into an ENDS latch 68 and a staging latch 67. The output of the ENDS latch 68 is connected to the ends signal lead 72. The purpose of the staging latch 67 is to activate the ends signal on lead 72 for two consecutive clock cycles. In this manner, the ends signal or lead 72 and a filling signal on lead 73 are activated in overlapping clock cycles. This overlapping eliminates glitching in the output pulse 30.

The pulse start signal 19 is also latched into staging latch 69 and the pulse stop signal from comparator 65 on line 34 is latched into a staging latch 70. The output of staging latch 69 sets a FILLER latch 71 and an output of staging latch 70 resets the FILLER latch 71. The output of the FILLER latch 71 is connected to the filler signal line 73. The end signal on line 72 allows the corrected tap signal 28 to be propagated to the output of an AND-OR circuit 74. The filler signal 73 is always propagated to the output of the AND-OR circuit 74. The purpose of the FILLER signal 73 is to activate the output pulse line 30 in the cycles between the pulse leading edge cycle and pulse trailing edge cycle. The AND-OR circuit 74 output is connected to the output pulse line 30.

Figure 4:
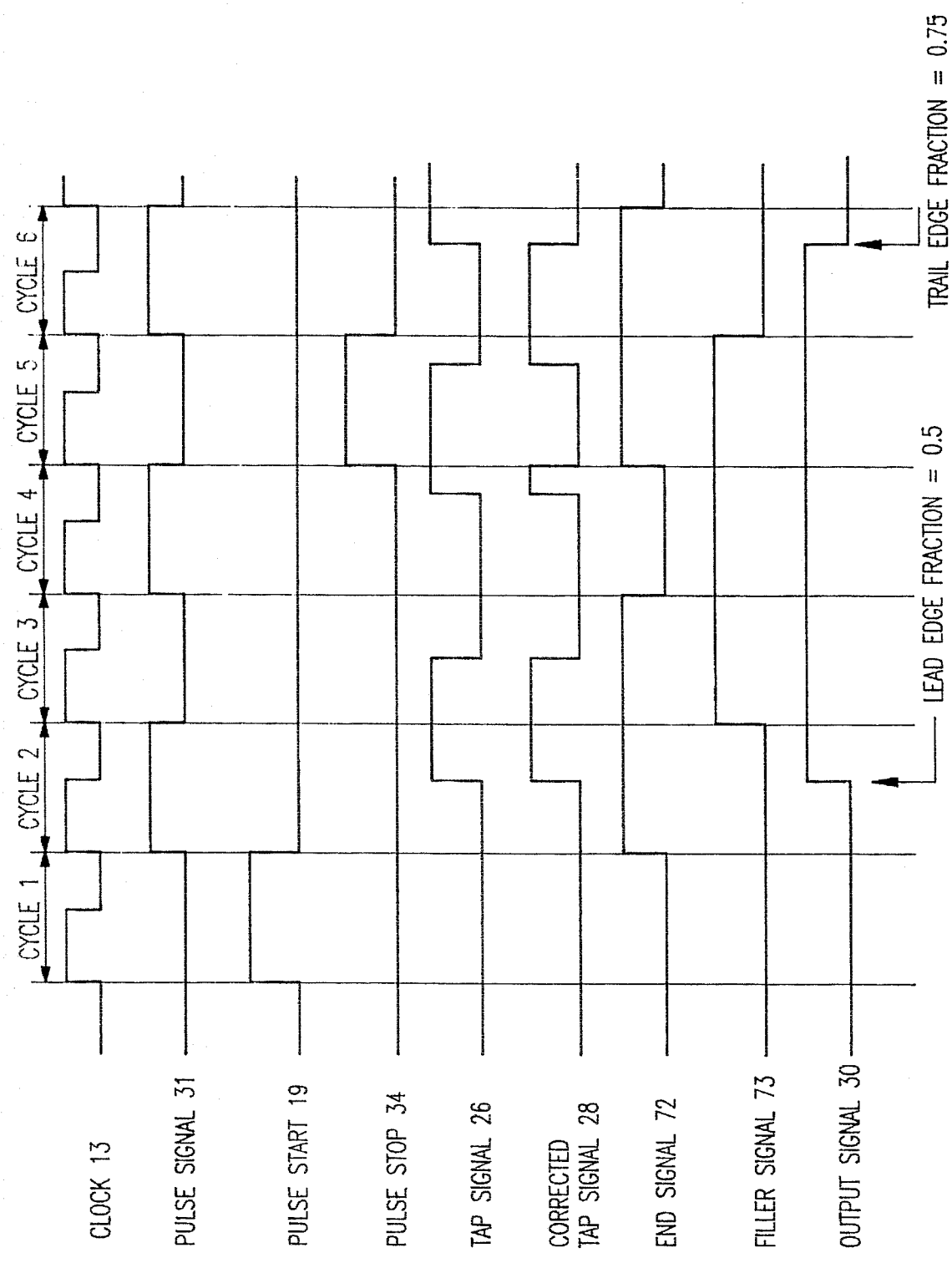
FIG. 4 is a timing diagram which illustrates the input and output waveforms of the pulse construction circuit.

The pulse construction timing diagram is shown in FIG. 4 where the signals are assigned a reference number that is the same as the line on which the signal appears. In this example the fine lead edge latch 22 and the fine trail edge latch 23 are initialized to 0.5 and 0.75, respectively. The tap signal 26 switches at exactly the middle of the cycle when generating the leading edge, i.e., when the fine lead edge latch 22 is selected via selector 21. The tap signal 26 switches exactly three-fourths into a clock cycle when generating the trailing edge, i.e., when the fine trail edge latch 23 is selected via selector 21. The tap signal 26 sometimes switches from low to high and sometimes switches from high to low. The corrected tap signal 28 always switches from low to high at exactly the middle of the cycle when the pulse construction circuit 29 is generating a leading edge. The corrected tap signal 28 always switches from high to low exactly three-fourths into a clock cycle when the pulse construction circuit 29 is generating a trailing edge.

The pulse start signal 19 activates the sequence in clock cycle 1. The end signal 72 is activated in clock cycles 2 and 3. In cycle 2 the corrected tap signal 28 is propagated to the output pulse 30. The filler signal 73 is activated in cycles 3, 4 and 5. The end signal 72 and filler signal 73 are both activated in cycle 3 (overlapped) to ensure that the output pulse 30 does not temporarily switch to a low logic level at the boundary between cycles 2 and 3. The filler signal 73 forces the output pulse 30 to activate during cycles 3, 4 and 5. The pulse stop signal 34 activates in cycle 5. The end signal 72 is once again activated for two cycles: cycles 5 and 6. The end signal 72 and filler signal 73 are both activated in cycle 5 (overlapped) to ensure that the output pulse 30 does not temporarily switch to a low logic level at the boundary between cycles 5 and 6. In cycle 6 the corrected tap signal 28 is propagated to the output pulse 30.

The self-compensating pulse generator described herein constructs accurate timing pulses (leading and trailing edge) independent of IC process variations and variations in operating temperature. This pulse generator is dynamic in the sense that the correction for the variance in logic block delays occurs every cycle. A sample and hold circuit is not required nor is it necessary to sequence reset, delay acquisition, adjustment, or hold phases. This invention provides a completely digital means to construct accurate timing pulses. A digital circuit is advantageous because it can be more readily tested via digital test patterns and can be imbedded into digital chip masterslices. This invention also provides a means to compensate for variations in clock frequencies (or periods).

The fine lead edge latch 22, fine trail edge latch 23 and coarse pulse width latch 64 can be re-initialized with different values to maintain the same pulse characteristics (lead edge, width and trail edge timings) over different clock frequencies. The self-compensating pulse generator just described can also be used to construct accurate timing pulses for asynchronous devices other than DRAMs.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for generating a timing signal with leading and trailing edges located independently with respect to one another and to an external synchronizing clock signal, the method comprising the steps of:

propagating a digital wave signal synchronized with said external synchronizing clock signal along a multi-stage digital delay chain whose propagation speed is a function of temperature and manufacturing tolerance build up;

determining a stage to which an edge of said digital wave signal propagates in one clock cycle;

multiplying a value assigned to said stage to which an edge of said digital wave signal propagates in one clock cycle with a fine edge value that specifies a desired location of an edge of said timing signal with respect to said external synchronizing clock signal;

selecting a stage of multi-stage digital delay chain, based on said multiplication step, where an edge of said digital wave signal is delayed with respect to an edge of said external synchronizing clock signal by an amount equal to said fine edge value; and constructing said timing signal with an input from a stage selected in said selecting step.

2. A method for generating a timing signal with leading and trailing edges located independently with respect to one another and to an external synchronizing clock signal as in claim 1, including the further step of selectively converting a rising edge of said timing signal to a falling edge and a falling edge to a rising edge.

* * * * *